US007849118B2

(12) United States Patent
Chien et al.

(10) Patent No.: US 7,849,118 B2
(45) Date of Patent: Dec. 7, 2010

(54) DATA TRANSFORMATION METHOD AND DATA TRANSFORMATION CIRCUIT CAPABLE OF SAVING NUMERAL OPERATIONS

(75) Inventors: Hung-Lun Chien, Taipei Hsien (TW); De-Yu Kao, Taipei (TW)

(73) Assignee: Princeton Technology Corporation, Hsin Tien, Taipei (TW)

( * ) Notice: Subject to any disclaimer, the term of this patent is extended or adjusted under 35 U.S.C. 154(b) by 987 days.

(21) Appl. No.: 11/627,335

(22) Filed: Jan. 25, 2007

(65) Prior Publication Data

US 2008/0109506 A1 May 8, 2008

(30) Foreign Application Priority Data

Oct. 24, 2006 (TW) .............................. 95139110 A

(51) Int. Cl.
*G06F 7/00* (2006.01)
(52) U.S. Cl. ...................................................... 708/203
(58) Field of Classification Search ...................... None
See application file for complete search history.

(56) References Cited

U.S. PATENT DOCUMENTS

| 4,967,388 | A * | 10/1990 | Tate ............................ 708/628 |
| 6,757,326 | B1 * | 6/2004 | Prieto et al. .................. 375/232 |
| 7,277,479 | B2 * | 10/2007 | Chiueh et al. ................ 375/229 |
| 2004/0076234 | A1 * | 4/2004 | Prieto et al. ............. 375/240.19 |
| 2004/0170223 | A1 * | 9/2004 | Chiueh et al. ................ 375/229 |
| 2009/0063599 | A1 * | 3/2009 | Reznik ........................ 708/201 |

* cited by examiner

*Primary Examiner*—David H Malzahn
(74) *Attorney, Agent, or Firm*—Winston Hsu; Scott Margo

(57) ABSTRACT

A data transformation method capable of saving numeral operations, the data transformation method includes encoding a plurality of digital data to generate a plurality of sets of byte data according to an encoding mode, determining a plurality of repetition patterns of the plurality of sets of byte data, processing shift operations on the plurality of sets of byte data to generate a plurality of sets of shifted byte data according to positions of the plurality of repetition patterns located in the plurality of sets of byte data, processing addition operations on the plurality of sets of shifted byte data.

20 Claims, 10 Drawing Sheets

| Multiplier coefficient | Value | CSD encoding |
|---|---|---|
| a(1) | 0.5113 | 0.1000_010$\bar{1}$_00$\bar{1}$0_0100 |
| a(2) | 0.4681 | 0.1000_$\bar{1}$000_0$\bar{1}$01_0101 |
| a(3) | 0.5024 | 0.1000_0000_1010_0$\bar{1}$01 |
| a(4) | 0.4936 | 0.1000_00$\bar{1}$0_10$\bar{1}$0_0$\bar{1}$00 |
| a(5) | 0.5174 | 0.1000_010$\bar{1}$_00$\bar{1}$0_0101 |

Fig. 3

| Multiplier coefficient | Value | CSD encoding |
|---|---|---|
| a(1) | 0.5113 | 0.1000_0101_00$\bar{1}$0_0101 |
| a(2) | 0.4681 | 0.1000_000$\bar{1}$_0101_0101 |
| a(3) | 0.5024 | 0.1000_0000_10$\bar{1}$0_0101 |
| a(4) | 0.4936 | 0.1000_00$\bar{1}$0_10$\bar{1}$0_0100 |
| a(5) | 0.5174 | 0.1000_0101_00$\bar{1}$0_0101 |

Fig. 4

| Color signal transforming coefficient | Value | ×1000 | CSD encoding |
|---|---|---|---|
| r1 | 0.299 | 299 | 0 0 0 1_0 0 1 0_0 1 0 $\bar{1}$ |
| r2 | -0.147 | -147 | 0 0 0 0_$\bar{1}$ 0 0 1_0 1 0 1 |
| r3 | 0.615 | 615 | 0 0 1 0_1 1 0 1_0 1 0 1 |
| g1 | 0.587 | 587 | 0 0 1 0_0 1 0 1_0 1 0 $\bar{1}$ |
| g2 | -0.289 | -289 | 0 0 0 $\bar{1}$_0 0 1 0_0 0 0 1 |
| g3 | -0.515 | -515 | 0 0 $\bar{1}$ 0_0 0 0 0_0 $\bar{1}$ 0 1 |
| b1 | 0.114 | 114 | 0 0 0 1_0 0 0 $\bar{1}$_0 0 1 0 |
| b2 | 0.436 | 436 | 0 0 0 1_0 $\bar{1}$ 0 1_0 1 0 $\bar{1}$ |
| b3 | -0.1 | -100 | 0 0 0 $\bar{1}$_0 0 1 0_0 $\bar{1}$ 0 0 |

Fig. 5

| Filtering coefficient | Value | ×1000 | CSD encoding |
|---|---|---|---|
| h0 | 0.0007 | 7 | 0000_0000_0000_100$\bar{1}$ |
| h1 | 0.0024 | 24 | 0000_0000_0010_$\bar{1}$000 |
| h2 | 0.0022 | 22 | 0000_0000_0010_$\bar{1}$0$\bar{1}$0 |
| h3 | -0.0008 | -8 | 0000_0000_0000_$\bar{1}$000 |
| h4 | -0.0046 | -46 | 0000_0000_0$\bar{1}$01_0010 |
| h5 | -0.0051 | -51 | 0000_0000_0$\bar{1}$01_0$\bar{1}$01 |
| h6 | 0 | 0 | 0000_0000_0000_0000 |
| h7 | 0.0076 | 76 | 0000_0000_0101_0$\bar{1}$00 |
| h8 | 0.0102 | 102 | 0000_0000_10$\bar{1}$0_10$\bar{1}$0 |
| h9 | 0.0026 | 26 | 0000_0000_0010_$\bar{1}$0$\bar{1}$0 |
| h10 | -0.0112 | -112 | 0000_0000_$\bar{1}$001_0000 |
| h11 | -0.0185 | -185 | 0000_000$\bar{1}$_0100_100$\bar{1}$ |

Fig. 6

| Filtering coefficient | CSD encoding | 1 | 10ī | 101 |
|---|---|---|---|---|
| h0 | 0000_0000_0000_100ī | +<<3, −0 | | |
| h1 | 0000_0000_0010_ī000 | | +<<3 | |
| h2 | 0000_0000_0010_ī0ī0 | +<<5 | | −<<1 |
| h3 | 0000_0000_0000_ī000 | −<<3 | | |
| h4 | 0000_0000_0ī01_0010 | +<<1 | −<<4 | |
| h5 | 0000_0000_0ī01_0ī01 | | −<<4, −<<0 | |
| h6 | 0000_0000_0000_0000 | | | |
| h7 | 0000_0000_0101_0ī00 | −<<2 | | |
| h8 | 0000_0000_10ī0_10ī0 | +<<1 | +<<1, +<<5 | +<<4 |
| h9 | 0000_0000_0010_ī010 | +<<4, −<<7 | +<<3 | |
| h10 | 0000_000ī_ī001_0000 | +<<3, −0 | | |
| h11 | 0000_000ī_0100_100ī | | −<<6 | |

| Filtering coefficient | CSD encoding | 1 | 10$\bar{1}$ | 101 | 100$\bar{1}$ | 1001 |
|---|---|---|---|---|---|---|
| h0 | 0000_0000_0000_100$\bar{1}$ | | | | | 1001 |
| h1 | 0000_0000_0010_$\bar{1}$000 | | +<<3 | | +0 | |
| h2 | 0000_0000_0010_$\bar{1}$0$\bar{1}$0 | +<<5 | | | | |
| h3 | 0000_0000_0000_$\bar{1}$000 | -<<3 | | -<<1 | | |
| h4 | 0000_0000_0010_0010 | +<<1 | -<<4 | | | |
| h5 | 0000_0000_0$\bar{1}$01_0010 | | -<<4, -<<0 | | | |
| h6 | 0000_0000_0$\bar{1}$01_0$\bar{1}$01 | -<<2 | | | | |
| h7 | 0000_0000_0000_0000 | | | | | |
| h8 | 0000_0000_0101_0$\bar{1}$00 | | +<<1, +<<5 | +<<4 | | |
| h9 | 0000_0000_10$\bar{1}$0_10$\bar{1}$0 | +<<1 | +<<3 | | | |
| h10 | 0000_0000_0010_$\bar{1}$010 | | | | -<<4 | |
| h11 | 0000_000$\bar{1}$_0100_100$\bar{1}$ | | -<<6 | | +0 | |

90

DATA TRANSFORMATION METHOD AND DATA TRANSFORMATION CIRCUIT CAPABLE OF SAVING NUMERAL OPERATIONS

BACKGROUND OF THE INVENTION

1. Field of the Invention

The present invention relates to a data transformation method and a data transformation circuit capable of saving numeral operations, and more particularly, to a data transformation method and a data transformation circuit encoding a plurality of digital data to save numeral operations according to a canonical signed digit (CSD) encoding.

2. Description of the Prior Art

Multipliers and adders are basic elements of an electronic system usually used in numeral operations. The usage of the multipliers and adders is rather frequent whenever in sigma-delta circuits, filters, or modulators. Factories are devoted to improving efficiency of circuit designs, such as improving the operational speed, reducing hardware devices, saving chip areas, and lowering power consumption. However, more and more numeral operations are needed with the increasing the complexity of chip functions, which result in more and more multipliers and adders being used in circuits. Thus not only manufacturing cost is increased but also hardware areas are increased.

Furthermore, the operations of the multipliers waste quite a lot of time, which will cause power consumption in the view of hardware structure. Hence, how to save numeral operations to save the usage of the multipliers and adders further becomes an import topic of the field.

SUMMARY OF THE INVENTION

The claimed invention provides a data transformation method capable of saving numeral operations. The data transformation method includes encoding a plurality of digital data to generate a plurality of sets of byte data according to an encoding mode, determining a plurality of repetition patterns in the plurality of sets of byte data, processing shift operations on the plurality of sets of byte data to generate a plurality of sets of shifted byte data according to positions of the plurality of repetition patterns located in the plurality of sets of byte data, and processing addition operations on the plurality of sets of shifted byte data.

The claimed invention provides a data transformation circuit capable of saving numeral operations. The data transformation circuit includes an encoding unit, a repetition pattern comparing unit, a shifter, and an adder. The encoding unit is used for encoding a plurality of digital data to generate a plurality of sets of byte data according to an encoding mode. The repetition pattern comparing unit is coupled to the encoding unit for determining a plurality of repetition patterns in the plurality of sets of byte data. The shifter is coupled to the encoding unit and to the repetition pattern comparing unit for processing shift operations on the plurality of sets of byte data to generate a plurality of sets of shifted byte data according to positions of the plurality of repetition patterns located in the plurality of sets of byte data.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram of a table illustrating encoding the multiplier coefficients in FIG. 2 according to a canonical signed digit (CSD) encoding.

FIG. 4 is a diagram of a table of modifying the least significant bit (LSB) in the table of FIG. 3 and determining a plurality of repetition patterns.

FIG. 5 is a diagram of a table illustrating encoding color signal transformation coefficients according to the canonical signed digit (CSD) encoding in the present invention.

FIG. 6 is a diagram of a table illustrating encoding filtering coefficients according to the canonical signed digit (CSD) encoding in the present invention.

FIG. 7 is a diagram of a table of determining a plurality of repetition patterns in the table of FIG. 6 and processing shift operations.

FIG. 9 is another diagram of a table of determining a plurality of repetition patterns in the table of FIG. 6 and processing shift operations.

DETAILED DESCRIPTION

The present invention utilizes a canonical signed digit (CSD) encoding to save numeral operations, and to go a step further, to decrease amounts of adders and multipliers. It is easily understood by those having average skill in this art, that the canonical signed digit (CSD) encoding can lower non-zero items of a CSD byte data to the least and can raise occurrence probability of repetition patterns. Therefore, the present invention is capable of reducing complexity of circuit structures and amounts of multipliers to save chip areas and to decrease power consumption of hardware manufacturing through the canonical signed digit (CSD) encoding. Methods of implementing multiplication operations can be replaced with shift operations and addition operations and will be explained afterward.

Figure 1:
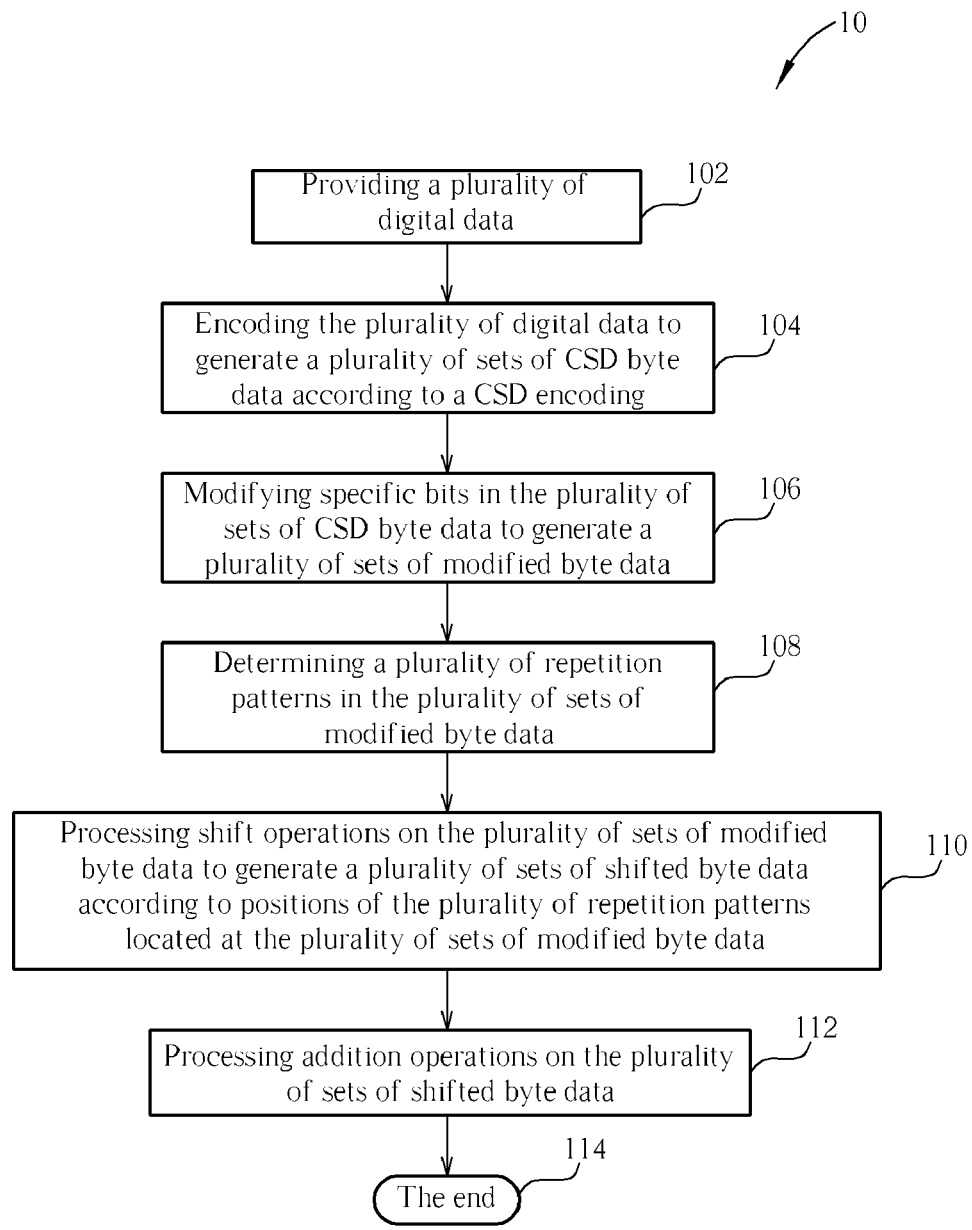
FIG. 1 is a diagram illustrating a flow of a data transformation method capable of saving numeral operations according to an embodiment of the present invention.

Please refer to FIG. 1. FIG. 1 is a diagram illustrating a flow 10 of a data transformation method capable of saving numeral operations according to an embodiment of the present invention. The flow 10 can be expressed in the following steps:

Step 102: Providing a plurality of digital data.

Step 104: Encoding the plurality of digital data to generate a plurality of sets of CSD byte data according to a CSD encoding.

Step 106: Modifying specific bits in the plurality of sets of CSD byte data to generate a plurality of sets of modified byte data.

Step 108: Determining a plurality of repetition patterns in the plurality of sets of modified byte data.

Step 110: Processing shift operations on the plurality of sets of modified byte data to generate a plurality of sets of shifted byte data according to positions of the plurality of repetition patterns located in the plurality of sets of modified byte data.

Step 112: Processing addition operations on the plurality of sets of shifted byte data.

Step 114: The end.

In step 104, the plurality of digital data is encoded according to the CSD encoding which has characteristics of lowering non-zero items of a CSD byte data to the least, non-zero items being not continuous, and occurrence probability of repetition patterns being higher. A plurality of sets of CSD byte data is generated to benefit the following numeral operations by the CSD encoding. Encoding manner in other types can also be used for encoding, but the less the non-zero items, the less the numeral operations or even the smaller the circuit areas. In step 106, specific bits in the plurality of sets of CSD byte data are modified to generate the plurality of sets of modified byte data to save more numeral operations. Going a step further, more repetition patterns are determined in the plurality of sets of modified byte data (step 108). Pay attention to the fact that the specific bits should be the least significant bit (LSB) in the plurality of sets of CSD byte data, which has little influence on the plurality of sets of CSD byte data. Hence, not only numeral operations can be saved, but also huge errors will not be caused. Moreover, step 106 can be omitted if the plurality of sets of original CSD byte data needs not to modify the specific bits to generate the plurality of sets of modified byte data. The plurality of repetition patterns in the plurality of sets of CSD byte data can be determined directly. In step 110, the shift operations are processed on the plurality of sets of modified byte data to generate the plurality of sets of shifted byte data according to the positions of the plurality of repetition patterns located in the plurality of sets of modified byte data. Finally, the addition operations are processed on the plurality of sets of shifted byte data. The shift operations and the addition operations are processed according to CSD bits in the plurality of CSD byte data. Multiplication operations can be saved through applications of the shift operations and the addition operations, which can save operation time and save more areas of circuit structures.

The canonical signed digit (CSD) encoding can lower non-zero items of the CSD byte data to the least and can raise occurrence probability of repetition patterns. In the canonical signed digit (CSD) encoding, values of the CSD bits can be +1, −1, or 0. The data transformation method described in the flow 10 can be applied to widespread ranges, for example, sigma-delta operations of sigma-delta circuits, color signal transforming of color space, multiplication operation simplifying of multipliers, or filtering coefficient adjustment of adaptive filters, etc. These applications of the data transformation method disclosed in the present invention will be explained in the following embodiments.

Figure 2:
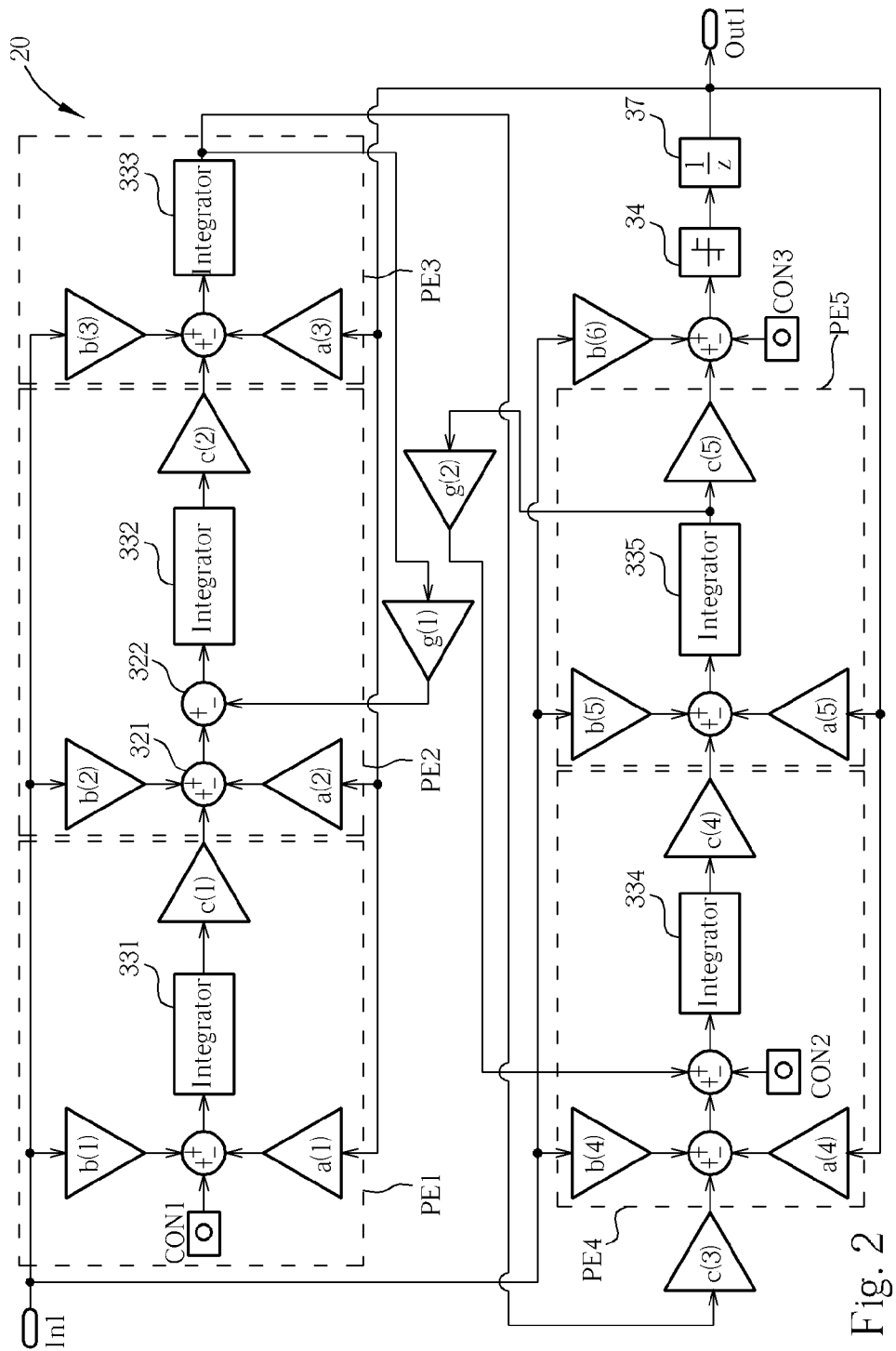
FIG. 2 is a diagram of a sigma-delta circuit.

Please refer to FIG. 2, which is a diagram of a fifth order sigma-delta circuit 20. As shown in FIG. 2, fifth order sigma-delta operations are executed by a first sigma-delta processing unit PE1, a second sigma-delta processing unit PE2, a third sigma-delta processing unit PE3, a fourth sigma-delta processing unit PE4, and a fifth sigma-delta processing unit PE5. Each sigma-delta processing unit at least includes a multiplier, an adder, and an integrator. For example, the second sigma-delta processing unit PE2 includes the multipliers a(2), b(2), g(1), and c(2), the integrator 332, and the adders 321 and 322. In FIG. 2, after a first order sigma-delta operation is processed on an input signal In1 by the first sigma-delta processing unit PE1, a second order sigma-delta operation, a third order sigma-delta operation, a fourth order sigma-delta operation, and a fifth order sigma-delta operation are processed in order. A quantizer 34 after processing the five orders of sigma-delta operations quantizes data, and then a delay clock unit 37 delays a unit period to output an output signal Out1. Five orders of the sigma-delta operations of the input signal In1 can be obtained by the fifth order sigma-delta circuit 20. However, the five orders of the sigma-delta circuit 20 need at least eight adders, eighteen multipliers, and five integrators. These elements will not only waste hardware areas but also waste time for numeral operations.

Please refer to FIG. 3. FIG. 3 is a diagram of a table 30 illustrating encoding the multiplier coefficients a(1)~a(5) in FIG. 2 according to a canonical signed digit (CSD) encoding. First, set the multiplier coefficient $a(i)=b(i)$, where $i=1~5$. In this embodiment, the multiplier coefficients a(1)~a(5) are only taken as an example. As shown in FIG. 3, the table 30 includes three fields which stand for the multiplier coefficients a(1)~a(5), values of the multiplier coefficients, and the CSD encoding of the multiplier coefficients in order. For example, the multiplier coefficient $a(1)=0.5113$ and can be expressed as 0.1000_010$\bar{1}$_00$\bar{1}$0_0100 according to the CSD encoding. The transformation rule in this case is that the least significant bit (LSB) represents $2^{-16}$, the most significant bit (MSB) represents $2^{-1}$, the intermediate bits represent $2^{-15}~2^{-2}$ (from right to left), and the values of the CSD bits can be +1, −1, or 0. To reason by analogy, the results of transforming the values of the multiplier coefficients a(2) a(5) according to the CSD encoding can be referred to the table 30 in FIG. 3.

Please refer to FIG. 4 and FIG. 3. FIG. 4 is a diagram of a table 40 of modifying the least significant bit (LSB) in the table 30 of FIG. 3 and determining a plurality of repetition patterns. The table 40 includes three fields which stand for the multiplier coefficients a(1)~a(5), values of the multiplier coefficients, and the CSD encoding of the multiplier coefficients in order. The difference between FIG. 4 and FIG. 3 is that the CSD encoding of the multiplier coefficients in FIG. 4 have already modified the least significant bit. As shown in FIG. 4, the original least significant bit of the multiplier coefficient a(1) is changed from "0" to "1" and then a repetition pattern 46 [0101] can be found, which is the same as the repetition pattern 46 located in the multiplier coefficients a(2) and the multiplier coefficients a(3). Due to the importance of the least significant bit having little influence to the value of the multiplier coefficient a(1), more repetition patterns 46 can be found through modifying the least significant bit and numeral operations can be simplified further. Moreover, a repetition pattern 42 [100001] can be found in the multiplier coefficient a(1), which is the same as the repetition pattern 42 located in the multiplier coefficients a(5). To reason by analogy, a repetition pattern 44 [$\bar{1}$00$\bar{1}$] can be found in the multiplier coefficients a(1), a(4), and a(5), a repetition pattern 48 [0$\bar{1}$01] can be found in the multiplier coefficients a(2), a(3), and a(4).

Please keep referring to FIG. 4. Through the repetition pattern 42 [100001], the repetition pattern 46 [0101], the repetition pattern 44 [$\bar{1}$00$\bar{1}$], and the repetition pattern 48 [0$\bar{1}$01], the values of the multiplier coefficients a(1)~a(5) can be simplified in the following equations:

$a(1)=100001+\bar{1}00\bar{1}>>7+0101>>12;$ $a(2)=>>1-1>>5+0\bar{1}01>>8+0101>>12;$ $a(3)=>>1+0101>>7+0\bar{1}01>>12;$ $a(4)=>>1+0\bar{1}01>>5+\bar{1}00\bar{1}>>10;$ and $a(5)=100001+\bar{1}00\bar{1}>>7+0101>>12;$ whereof the symbol ">>" represents shift, the symbol "+" represents an addition operation, the symbol "−" represents a subtraction operation, and the numerals represent shifted bits, for example, >>7 represents shifting 7 bits. Thus the multiplier coefficients a(1)~a(5) can be expressed by the repetition pattern 42 [100001], the repetition pattern 46 [0101], the repetition pattern 44 [$\bar{1}00\bar{1}$], and the repetition pattern 48 [0$\bar{1}01$], and as shown in the abovementioned equations, which has processed shift operations on them.

Please refer to FIG. 5, which is a diagram of a table 50 illustrating encoding color signal transformation coefficients according to the canonical signed digit (CSD) encoding in the present invention. When processing images, image data usually need to be transformed between different color spaces. A color space can be a three-dimensional or a multi-dimensional vector space, and its three-dimensional or multi-dimensional vectors define color axes of the color space. A common color space is a RGB color space, which is defined by center wavelengths of three fundamental colors R, G, and B. Another color space with given color axes can be expressed by the RGB color space and a 3×3 matrix, for example, three color axes Y, I, and Q can be expressed in the following equation:

$$\begin{bmatrix} Y \\ I \\ Q \end{bmatrix} = \begin{bmatrix} 0.299 & 0.587 & 0.114 \\ -0.1470 & -0.289 & 0.436 \\ 0.615 & -0.5150 & -0.100 \end{bmatrix} \begin{bmatrix} R \\ G \\ B \end{bmatrix};$$

where each numerical in the 3×3 matrix individually represents a transformation coefficient of transforming signals R, G, and B into signals Y, I, and Q and is symbolized by r1-r3, g1-g3, and b1-b3.

Please continue to refer to FIG. 5. As shown in FIG. 5, the table 50 includes four fields which stand for the color signal transformation coefficients, values of the color signal transformation coefficients, values of the color signal transformation coefficients after multiplying by 1,000, and the CSD encoding of the color signal transformation coefficients in order. For example, the color signal transformation coefficient $r_2 = -0.147$ having a value of −147 after multiplying by 1,000, and can be expressed as 0000_$\bar{1}00\bar{1}$_0$\bar{1}$01 according to the CSD encoding. The transformation rule in this case is that the least significant bit (LSB) represents $2^0$, the most significant bit (MSB) represents $2^{11}$, the intermediate bits represent $2^1 \sim 2^{10}$ (from right to left), and the values of the CSD bits can be +1, −1, or 0. To reason by analogy, the results of transforming the values of the color signal transformation coefficients $r_1$-$r_3$, $g_1$-$g_3$, and $b_1$-$b_3$ according to the CSD encoding can be referred to the table 50 in FIG. 5.

Please keep referring to FIG. 5. Through a repetition pattern 52 [1001], a repetition pattern 54 [$\bar{1}00\bar{1}$], a repetition pattern 56 [$\bar{1}001$], a repetition pattern 57 [10$\bar{1}$], and a repetition pattern 58 [$\bar{1}01$], the values of the color signal transformation coefficients $r_1$-$r_3$, $g_1$-$g_3$, and $b_1$-$b_3$ can be simplified. In that case, the repetition pattern 57 [10$\bar{1}$] is the same as the repetition pattern 58 [$\bar{1}01$] essentially which can be simplified further, due to 10$\bar{1}$=−($\bar{1}01$). Hence, the color signal transformation coefficients $r_1$-$r_3$, $g_1$-$g_3$, and $b_1$-$b_3$ can be expressed by the repetition pattern 52 [1001], the repetition pattern 54 [$\bar{1}00\bar{1}$], the repetition pattern 56 [$\bar{1}001$], and the repetition pattern 57 [10$\bar{1}$] through shift operations and addition operations.

Please keep referring to FIG. 5. Through the repetition pattern 52 [1001], the repetition pattern 54 [$\bar{1}00\bar{1}$], the repetition pattern 56 [$\bar{1}001$], the repetition pattern 57 [10$\bar{1}$], and the repetition pattern 58 [$\bar{1}01$], the values of the color signal transformation coefficients $r_1$-$r_3$, $g_1$-$g_3$, and $b_1$-$b_3$ can be simplified in the following equations:

$$r_1 = 1001 >> 3 + 10\bar{1} >> 7 - 1 >> 11;$$

$$r_2 = \bar{1}00\bar{1} >> 4 + \bar{1}01 >> 9;$$

$$r_3 = 1 >> 2 + 1 >> 4 + \bar{1}01 >> 5 + 10\bar{1} >> 9;$$

$$g_1 = 1001 >> 2 + 10\bar{1} >> 7 - 1 >> 11;$$

$$g_2 = \bar{1}00\bar{1} >> 3 - 1 >> 11;$$

$$g_3 = -1 >> 2 + \bar{1}01 >> 9;$$

$$b_1 = 1 >> 2 + \bar{1}001 >> 9;$$

$$b_2 = 10\bar{1} >> 3 - 1 >> 7 + 10\bar{1} >> 9; \text{ and}$$

$$b_3 = \bar{1}001 >> 3 - 1 >> 9;$$

whereof the symbol ">>" represents shift, the symbol "+" represents an addition operation, the symbol "−" represents a subtraction operation, and the numerals represent shifted bits, for example, >>7 represents shifting 7 bits. Thus the color signal transformation coefficients $r_1$-$r_3$, $g_1$-$g_3$, and $b_1$-$b_3$ can be expressed by the repetition pattern 52 [1001], the repetition pattern 54 [$\bar{1}00\bar{1}$], the repetition pattern 56 [$\bar{1}001$], the repetition pattern 57 [10$\bar{1}$], and the repetition pattern 58 [$\bar{1}01$], and as shown in the abovementioned equations, which has processed shift operations on them. Furthermore, the values of the color signal transformation coefficients $r_1$-$r_3$, $g_1$-$g_3$, and $b_1$-$b_3$ are further simplified by utilizing the relation 10$\bar{1}$=−($\bar{1}01$), and the values can be expressed by the repetition pattern 52 [1001], the repetition pattern 54 [$\bar{1}00\bar{1}$], the repetition pattern 56 [$\bar{1}001$], and the repetition pattern 57 [10$\bar{1}$].

Please refer to FIG. 3 and FIG. 5. Deserving to be noted, the transformation rule of the CSD encoding in FIG. 3 is that the least significant bit (LSB) represents $2^{-16}$, the most significant bit (MSB) represents $2^{-1}$, the intermediate bits represent $2^{-15} \sim 2^{-2}$ (from right to left), and the values of the CSD bits can be +1, −1, or 0. But in FIG. 5, the values of the color signal transformation coefficients are multiplied by 1,000 before transforming into the CSD encoding, and its transformation rule is that the least significant bit (LSB) represents $2^0$, the most significant bit (MSB) represents $2^{11}$, the intermediate bits represent $2^1 \sim 2^{10}$ (from right to left), and the values of the CSD bits can be +1, −1, or 0. Although the two transformation rules are different from each other, both of them can lower non-zero items to the least and can disclose the data transformation method of the present invention. The abovementioned embodiments are presented merely for describing the present invention, and other transformation rules should also belong to the cover range of the present invention.

Please refer to FIG. 6, which is a diagram of a table 60 illustrating encoding filtering coefficients according to the canonical signed digit (CSD) encoding in the present invention. The table 60 includes four fields which stand for the filtering coefficients, values of the filtering coefficients, values of the filtering coefficients after multiplying by 10,000, and the CSD encoding of the filtering coefficients in order. For example, the filtering coefficient $h_0 = 0.0007$ having a value of 7 after multiplying by 10,000, and can be expressed as 0000_0000_0000_100$\bar{1}$ according to the CSD encoding. The transformation rule in this case is that the least significant bit (LSB) represents $2^0$, the most significant bit (MSB) represents $2^{15}$, the intermediate bits represent $2^1 \sim 2^{14}$ (from right to left), and the values of the CSD bits can be +1, −1, or 0. To reason by analogy, the results of transforming the values of the filtering coefficients $h_0$-$h_{11}$ according to the CSD encoding can be referred to the table 60 in FIG. 6.

Please refer to FIG. 7 and FIG. 6. FIG. 7 is a diagram of a table 70 of determining a plurality of repetition patterns in the table 60 of FIG. 6 and processing shift operations. The table 70 includes five fields which stand for the filtering coefficients $h_0$-$h_{11}$, the CSD encoding of the filtering coefficients, the repetition pattern [1], the repetition pattern [10$\bar{1}$], and the repetition pattern [101] in order. For example, the filtering coefficient $h_0$ can be expressed by 0000_0000_0000_100$\bar{1}$. If it is changed to be expressed by the repetition patterns, then the filtering coefficient $h_0$ can be expressed by the repetition pattern [1] of "−0" and "+<<3" (the symbol ">>" represents shift, the symbol "+" represents an addition operation, the symbol "−" represents a subtraction operation, and the numerals represent shifted bits). Take the filtering coefficient $h_2$ for example again, the filtering coefficient $h_2$ can be expressed by 0000_0000_0010_$\bar{1}$0$\bar{1}$0. If it is changed to be expressed by the repetition patterns, then the filtering coefficient $h_2$ can be expressed by the repetition pattern [1] of "+<<5" and the repetition pattern [101] of "−<<1" (that means shifting the repetition pattern [1] left for five bits and processing an addition operation, shifting the repetition pattern [101] left for one bit and processing a subtraction operation). To reason by analogy, the results of transforming the values of the filtering coefficient $h_0$~$h_{11}$ according to the CSD encoding can be referred to the table 70 in FIG. 7.

Figure 8:
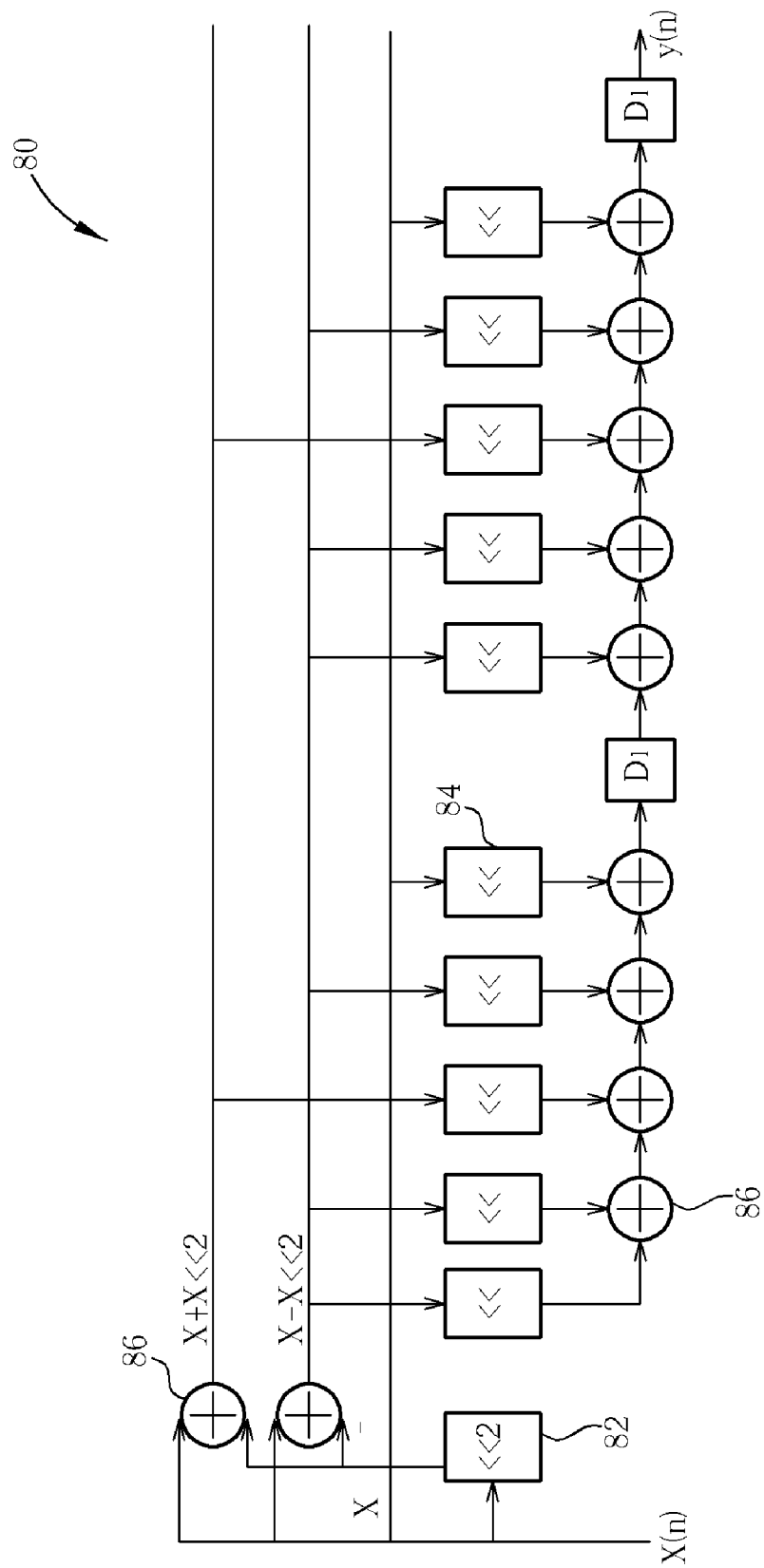
FIG. 8 is a diagram of a filtering coefficient generator constructed based on the table in FIG. 7.

Please refer to FIG. 8 and FIG. 7. FIG. 8 is a diagram of a filtering coefficient generator 80 constructed based on the table 70 in FIG. 7. The filtering coefficient generator 80 includes a plurality of adders 86, a second shifter 82, a plurality of first shifters 84, and two delays D1. An input signal X(n) is inputted into the filtering coefficient generator 80, and a coefficient is generated finally to output an output signal y(n) after operations of the plurality of adders 86, the second shifter 82, the plurality of first shifters 84, and the two delays D1. A signal X<<2 is generated after the input signal X through the second shifter 82. In the first framework, a signal X+X<<2 is obtained after the adder 86 processes an addition operation on the input signal X and the signal X<<2, that is the repetition pattern [101] in FIG. 7. Similarly, a signal X−X<<2 is obtained after the adder 86 processes an addition operation on the input signal X and a inverted signal (−X<<2) in the second framework, that is the repetition pattern [10$\bar{1}$] in FIG. 7. The plurality of first shifters 84 are used for processing shift operations on the repetition pattern [1], [10$\bar{1}$], and [101] in FIG. 7 and the numbers desired to be shifted can be determined depending on the amount of the first shifters 84. Finally, the output signal y(n) is generated through the two delays D1. The filtering $h_0$~$h_{11}$ in the table 70 can be implemented by the filtering coefficient generator 80 through the plurality of adders 86, the second shifter 82, and the plurality of first shifters 84.

Please refer to FIG. 9, which is another diagram of a table 90 of determining a plurality of repetition patterns in the table 60 of FIG. 6 and processing shift operations. The table 90 includes seven fields which stand for the filtering coefficients $h_0$-$h_{11}$, the CSD encoding of the filtering coefficients, the repetition pattern [1], the repetition pattern [10$\bar{1}$], the repetition pattern [101], the repetition pattern [100$\bar{1}$], and the repetition pattern [1001] in order. For example, the filtering coefficient $h_0$ can be expressed by 0000_0000_0000_100$\bar{1}$. If it is changed to be expressed by the repetition patterns, then the filtering coefficient $h_0$ can be expressed by the repetition pattern [100$\bar{1}$] of "0" (that means processing an addition operation on the repetition pattern [100$\bar{1}$]). Take the filtering coefficient $h_{11}$ for example again, the filtering coefficient $h_{11}$ can be expressed by 0000_000$\bar{1}$_0100_100$\bar{1}$. If it is changed to be expressed by the repetition patterns, then the filtering coefficient $h_{11}$ can be expressed by the repetition pattern [10$\bar{1}$] of "−<<6" and the repetition pattern [100$\bar{1}$] of "0" (that means shifting the repetition pattern [10$\bar{1}$] left for six bits and processing a subtraction operation, and processing an addition operation on the repetition pattern [100$\bar{1}$]). To reason by analogy, the values of the filtering coefficient $h_0$~$h_{11}$ can be expressed by the repetition pattern [1], the repetition pattern [10$\bar{1}$], the repetition pattern [101], the repetition pattern [100$\bar{1}$], and the repetition pattern [1001] through shift operations and addition operations. The results of transforming the values of the filtering coefficient $h_0$~$h_{11}$ according to the CSD encoding can be referred to the table 90 in FIG. 9.

Please refer to FIG. 9 and FIG. 7. A common multiplication simplified manner always use shift operations, addition operations, and subtraction operations to replace multiplication operations. The calculation amounts of the addition operations and subtraction operations are further decreased through the CSD encoding. The calculation amounts of the addition operations and subtraction operations in FIG. 7 are still too many due to the repetition pattern [1] occurring too many times. One solution to solve the abovementioned problem is to increase the repetition pattern [100$\bar{1}$] and the repetition pattern [1001] (as shown in FIG. 9). As a result, the occurrence of the repetition pattern [1] can be decreased to lower more calculation amounts of the addition operations and subtraction operations. Thus it can be seen that more calculation amounts of the addition operations and subtraction operations can be lowered through increasing the repetition pattern [1000$\bar{1}$] and the repetition pattern [10001].

Please refer to FIG. 9 and FIG. 5. Deserving to be noted, the color signal transformation coefficients are multiplied by 1,000 before transforming into the CSD encoding in FIG. 5. The LSB of the plurality of sets of CSD byte data is modified to generate a plurality of sets of modified byte data, and then a plurality of repetition patterns are determined in the plurality of sets of modified byte data. The plurality of repetition patterns can be searched according to recent data and are not limited to fixed patterns only. But in FIG. 9, the values of the filtering coefficients are multiplied by 10,000 before transforming into the CSD encoding. Some fixed patterns such as the repetition pattern [1], the repetition pattern [10$\bar{1}$], the repetition pattern [101], the repetition pattern [100$\bar{1}$], and the repetition pattern [1001] are used for repressing the filtering coefficients. Although the two transformation rules are different from each other, both of them can lower non-zero items to the least and can disclose the data transformation method of the present invention. The abovementioned embodiments are presented merely for describing the present invention, and other transformation rules should also belong to the cover range of the present invention. Besides, in FIG. 9 more calculation amounts of the addition operations and subtraction operations can be lowered through modifying the LSB in the CSD byte data.

Figure 10:
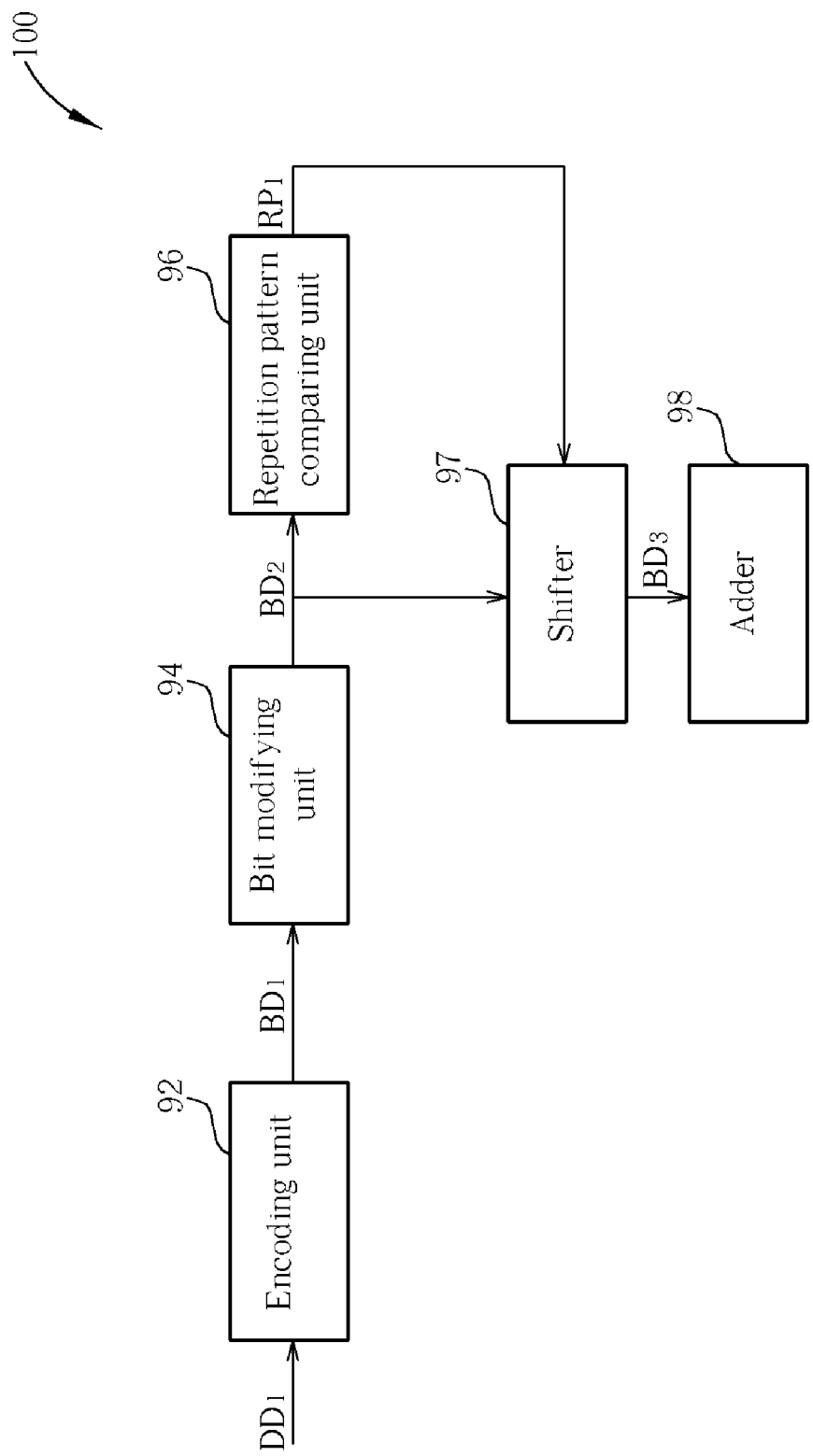
FIG. 10 is a diagram of a data transformation circuit capable of saving numeral operations according to an embodiment of the present invention.

Please refer to FIG. 10. FIG. 10 is a diagram of a data transformation circuit 100 capable of saving numeral operations according to an embodiment of the present invention. The data transformation circuit 100 includes an encoding unit 92, a bit modifying unit 94, a repetition pattern comparing unit 96, a shifter 97, and an adder 98. The encoding unit 92 is used for encoding a plurality of digital data $DD_1$ to generate a plurality of sets of byte data $BD_1$ according to an encoding mode. The bit modifying unit 94 is coupled between the encoding unit 92 and the repetition pattern comparing unit 96. The bit modifying unit 94 is used for receiving the plurality of sets of byte data $BD_1$ and modifying specific bits in the plurality of sets of byte data $BD_1$ to generate a plurality of sets of modified byte data $BD_2$. The repetition pattern comparing unit 96 is coupled to the bit modifying unit 94 for determining a plurality of repetition patterns $RP_1$ in the plurality of sets of modified byte data $BD_2$. The shifter 97 is coupled to the bit modifying unit 94 and to the repetition pattern comparing unit 96 for processing shift operations on the plurality of sets of modified byte data $BD_2$ to generate a plurality of sets of shifted byte data $BD_3$ according to positions of the plurality of repetition patterns $RP_1$ located in the plurality of sets of modified byte data $BD_2$. The adder 98 is coupled to the shifter 97. The adder 98 is used for processing addition operations on the plurality of sets of shifted byte data $BD_3$. The encoding unit 92 is a CSD encoder, which utilizes the CSD encoding for encoding the plurality of digital data $DD_1$ to generate a plurality of sets of byte data $BD_1$. The data transformation circuit 100 can be applied to sigma-delta operations of sigma-delta circuits, color signal transforming of a color space, multiplication operation simplifying of multipliers, and filtering coefficient adjustment of adaptive filters. The encoding unit 92 is not limited to the CSD encoder only and can be implemented in other encoders. Please note that, the bit modifying unit 94 can be omitted if the original plurality of sets of byte data $BD_1$ do not need to modify specific bits to generate the plurality of sets of modified byte data $BD_2$. The encoding unit 92 is directly coupled to the repetition pattern comparing unit 96 for determining the plurality of repetition patterns in the plurality of sets of byte data $BD_1$.

The abovementioned embodiments are presented merely for describing the present invention, and in no way should be considered to be limitations of the scope of the present invention. The CSD encoding is just an embodiment for the data transformation method disclosed in the present invention, and the encoding manner in other types can also be used for encoding. The data transformation method described in the flow 10 can be applied to widespread ranges, for example, sigma-delta operations of sigma-delta circuits, color signal transforming of color space, multiplication operation simplifying of multipliers, or filtering coefficient adjustment of adaptive filters, etc., The data transformation method is not limited to the application ranges only, and can be applied to other ranges. Although both the table 30 and the table 50 use the CSD encoding, the two transformation rules of them are different from each other and not limited to a certain one. Similarly, please compare the table 50 with the table 90. Although both of them use the CSD encoding and have the same transformation rules, the repetition patterns in the table 50 are non-fixed but the repetition patterns in the table 90 are fixed. The abovementioned embodiments are presented merely for describing the present invention, and other transformation rules should also belong to the cover range of the present invention. Furthermore, it is not necessary to modify specific bits in the plurality of sets of byte data $BD_1$ to generate the plurality of sets of modified byte data $BD_2$ through the bit modifying unit 94. The bit modifying unit 94 may be an optional element and can be omitted. The encoding unit 92 is not limited to the CSD encoder only and can be implemented in other encoders.

From the above descriptions, the present invention provides a data transformation method and a data transformation circuit capable of saving numeral operations. The canonical signed digit (CSD) encoding can lower non-zero items of a CSD byte data to the least and can raise occurrence probability of repetition patterns. The data transformation method disclosed in the present invention can be applied to widespread ranges, for example, sigma-delta operations of sigma-delta circuits, color signal transforming of color space, multiplication operation simplifying of multipliers, or filtering coefficient adjustment of adaptive filters, etc. Therefore, the present invention is capable of saving numeral operations to save more circuit hardware areas further. Besides, more repetition patterns can be found through modifying the LSB in the plurality of sets of CSD byte data, which can further save more and more numeral operations to make effect still more remarkable.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data transformation method capable of saving numeral operations comprising:
   encoding a plurality of digital data to generate a plurality of sets of byte data according to an encoding mode;
   determining a plurality of repetition patterns in the plurality of sets of byte data;
   processing shift operations on the plurality of repetition patterns to generate a plurality of sets of shifted byte data according to positions of the plurality of repetition patterns located in the plurality of sets of byte data; and
   processing addition operations on the plurality of sets of shifted byte data.

2. The data transformation method of claim 1 further comprising:
   modifying specific bits in the plurality of repetition patterns to generate a plurality of sets of modified byte data;
   determining the plurality of repetition patterns in the plurality of sets of modified byte data;
   processing shift operations on the plurality of repetition patterns to generate the plurality of sets of shifted byte data according to positions of the plurality of repetition patterns located in the plurality of sets of modified byte data; and
   processing addition operations on the plurality of sets of shifted byte data.

3. The data transformation method of claim 2 wherein modifying specific bits in the plurality of sets of byte data is modifying the least significant bit (LSB) in the plurality of sets of byte data.

4. The data transformation method of claim 1 wherein the encoding mode is a canonical signed digit (CSD) encoding.

5. The data transformation method of claim 4 wherein the shift operations and the addition operations are processed by CSD bits in the plurality of sets of byte data.

6. The data transformation method of claim 5 wherein values of the CSD bits in the plurality of sets of byte data and in the plurality of sets of modified byte data can be +1, −1 or 0.

7. The data transformation method of claim 1 wherein the data transformation method is applied to sigma-delta operations of sigma-delta circuits, color signal transforming of a color space, multiplication operation simplifying of multipliers or filtering coefficient adjustment of adaptive filters.

8. A data transformation circuit capable of saving numeral operations comprising:
   an encoding unit used for encoding a plurality of digital data to generate a plurality of sets of byte data according to an encoding mode;
   a repetition pattern comparing unit coupled to the encoding unit for determining a plurality of repetition patterns in the plurality of sets of byte data;
   a shifter coupled to the encoding unit and the repetition pattern comparing unit for processing shift operations on the plurality of repetition patterns to generate a plurality of sets of shifted byte data according to positions of the plurality of repetition patterns located in the plurality of sets of byte data; and an adder coupled to the shifter for processing addition operations on the plurality of sets of shifted byte data.

9. The data transformation circuit of claim 8 further comprising:

a bit modifying unit coupled between the encoding unit and the repetition pattern comparing unit, the bit modifying unit used for modifying specific bits in the plurality of sets of byte data to generate a plurality of sets of modified byte data;

the repetition pattern comparing unit coupled to the bit modifying unit for determining a plurality of repetition patterns in the plurality of sets of modified byte data;

a shifter coupled to the bit modifying unit and the repetition pattern comparing unit for processing shift operations on the plurality of repetition patterns to generate a plurality of sets of shifted byte data according to positions of the plurality of repetition patterns located in the plurality of sets of modified byte data; and an adder coupled to the shifter for processing addition operations on the plurality of sets of shifted byte data.

10. The data transformation circuit of claim 9 wherein the bit modifying unit is used for modifying the least significant bit (LSB) in the plurality of sets of byte data to generate the plurality of sets of modified byte data.

11. The data transformation circuit of claim 8 wherein the encoding unit is a CSD encoder.

12. The data transformation circuit of claim 11 wherein the CSD encoder employs a canonical signed digit (CSD) encoding to encode the plurality of digital data to generate the plurality of sets of byte data.

13. The data transformation circuit of claim 11 wherein the shifter and the adder are processed by CSD bits in the plurality of sets of byte data.

14. The data transformation circuit of claim 13 wherein the values of the CSD bits in the plurality of sets of byte data and in the plurality of sets of modified byte data can be +1.

15. The data transformation circuit of claim 13 wherein the values of the CSD bits in the plurality of sets of byte data and in the plurality of sets of modified byte data can be −1.

16. The data transformation circuit of claim 13 wherein the values of the CSD bits in the plurality of sets of byte data and in the plurality of sets of modified byte data can be 0.

17. The data transformation circuit of claim 8 wherein the data transformation circuit is applied to sigma-delta operations of sigma-delta circuits.

18. The data transformation circuit of claim 8 wherein the data transformation circuit is applied to color signal transforming of a color space.

19. The data transformation circuit of claim 8 wherein the data transformation circuit is applied to multiplication operation simplifying of multipliers.

20. The data transformation circuit of claim 8 wherein the data transformation circuit is applied to filtering coefficient adjustment of adaptive filters.

* * * * *